(12) United States Patent
Seki

(10) Patent No.: US 10,038,502 B1
(45) Date of Patent: Jul. 31, 2018

(54) LIGHTING DEVICE, LUMINAIRE, AND SIGNBOARD

(71) Applicant: Panasonic Intellectual Property Management Co., Ltd., Osaka (JP)

(72) Inventor: Keisuke Seki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/877,582

(22) Filed: Jan. 23, 2018

(30) Foreign Application Priority Data

Jan. 30, 2017 (JP) ................................. 2017-014871

(51) Int. Cl.
| | | |
|---|---|---|
| *G05F 1/00* | (2006.01) | |
| *H05B 37/02* | (2006.01) | |
| *H05B 39/04* | (2006.01) | |
| *H05B 41/36* | (2006.01) | |
| *H04B 10/116* | (2013.01) | |
| *G05F 1/575* | (2006.01) | |
| *H01L 31/02* | (2006.01) | |
| *H05B 33/08* | (2006.01) | |

(52) U.S. Cl.
CPC .......... *H04B 10/116* (2013.01); *G05F 1/575* (2013.01); *H01L 31/02024* (2013.01); *H05B 33/0815* (2013.01); *H05B 33/0887* (2013.01)

(58) Field of Classification Search
None
See application file for complete search history.

(56) References Cited

U.S. PATENT DOCUMENTS

| | | | |
|---|---|---|---|
| 2012/0051757 A1* | 3/2012 | Nishino | H04B 10/1149 398/201 |
| 2013/0015784 A1 | 1/2013 | Kamada et al. | |
| 2013/0015785 A1 | 1/2013 | Kamada et al. | |
| 2014/0286645 A1 | 9/2014 | Kido et al. | |
| 2014/0334826 A1* | 11/2014 | Kido | H04B 10/116 398/130 |
| 2016/0150611 A1 | 5/2016 | Himeda et al. | |

(Continued)

FOREIGN PATENT DOCUMENTS

| | | |
|---|---|---|
| JP | 2012-134691 | 7/2012 |
| JP | 2013-26690 | 2/2013 |
| JP | 2013-26691 | 2/2013 |

(Continued)

*Primary Examiner* — Anh Tran
(74) *Attorney, Agent, or Firm* — Renner Otto Boisselle & Sklar, LLP

(57) ABSTRACT

A lighting device includes: a DC power supply circuit which supplies a light-emitting element with a first voltage; a signal generation circuit which generates a control signal based on a visible light communication signal; a current control element which is connected in series to the light-emitting element and turned on and off based on the control signal; a DC power supply control circuit which causes a second voltage at a first node between the light-emitting element and the current control element to be a constant value, by controlling the DC power supply circuit based on the second voltage; and a first feedback circuit which supplies the DC power supply control circuit with the second voltage. The first feedback circuit supplies the DC power supply control circuit with a predetermined voltage in a period in which the current control element is off.

14 Claims, 19 Drawing Sheets

(56) References Cited

U.S. PATENT DOCUMENTS

2017/0188420 A1* 6/2017 Kido .................... H05B 33/089

FOREIGN PATENT DOCUMENTS

| JP | 2013-026692 | 2/2013 |
| JP | 2013-110634 | 6/2013 |
| JP | 2014-216878 | 11/2014 |
| JP | 2016-100164 | 5/2016 |

* cited by examiner

LIGHTING DEVICE, LUMINAIRE, AND SIGNBOARD

CROSS REFERENCE TO RELATED APPLICATION

This application claims the benefit of priority of Japanese Patent Application Number 2017-014871 filed on Jan. 30, 2017, the entire content of which is hereby incorporated by reference.

BACKGROUND

1. Technical Field

The present disclosure relates to lighting devices, luminaires, and signboards, and in particular to a lighting device which supplies a light-emitting element with a current modulated based on a visible light communication signal.

2. Description of the Related Art

Patent Literature (PTL) 1 (Japanese Unexamined Patent Application Publication No. 2016-100164) discloses a lighting device and a luminaire including a constant current circuit. Meanwhile, lighting devices and luminaires compatible with visible light communication have been considered.

SUMMARY

For such lighting devices and luminaires, improvement in an operation stability is demanded.

In view of this, the present disclosure has an object to provide a lighting device, a luminaire, or a signboard capable of improving the operation stability.

A lighting device according to one aspect of the present disclosure is a lighting device which supplies a light-emitting element with a current modulated based on a visible light communication signal. The lighting device includes: a DC power supply circuit which supplies the light-emitting element with a first voltage; a signal generation circuit which generates a control signal based on the visible light communication signal, the control signal causing an average current value of a current flowing through the light-emitting element to be constant; a current control element which is connected in series to the light-emitting element and turned on and off based on the control signal; a DC power supply control circuit which causes a second voltage at a first node between the light-emitting element and the current control element to be a constant value, by controlling the DC power supply circuit based on the second voltage; and a first feedback circuit which is connected between the first node and the DC power supply control circuit, and supplies the DC power supply control circuit with the second voltage. The first feedback circuit supplies the DC power supply control circuit with a predetermined voltage in a period in which the current control element is off.

The present disclosure provides a lighting device, a luminaire, or a signboard capable of improving the operation stability.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Hereinafter, embodiments of the present disclosure will be described with reference to the drawings. Each of the embodiments described below shows a specific example of the present disclosure. Therefore, numerical values, shapes, materials, structural components, the arrangement and connection of the structural components, etc. shown in the following embodiments are mere examples, and are not intended to limit the scope of the present disclosure. Accordingly, among the structural components in the following embodiments, structural components no recited in any one of the independent claims which indicate the broadest concept of the present disclosure are described as optional structural components.

It should be noted that the figures are schematic diagrams and are not necessarily precise illustrations. Moreover, in the figures, substantially identical components are assigned the same reference signs, and overlapping description thereof is omitted or simplified.

Embodiment 1

[Configuration of Luminaire]

Figure 1:
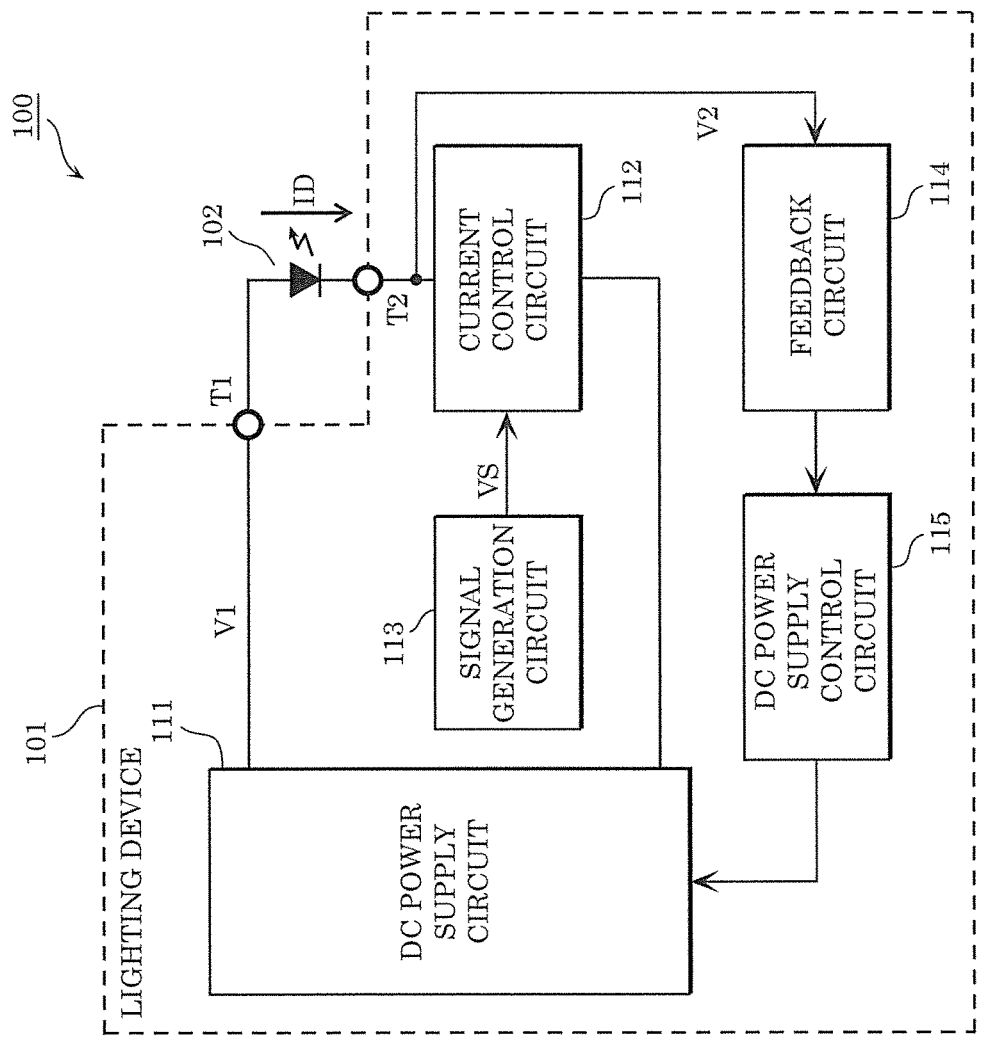
FIG. 1 is a diagram illustrating an exemplary configuration of a luminaire according to Embodiment 1.

First, a configuration of luminaire 100 according to Embodiment 1 will be described. FIG. 1 is a diagram illustrating the configuration of luminaire 100 according to Embodiment 1. As illustrated in FIG. 1, luminaire 100 includes lighting device 101 and light-emitting element 102.

Light-emitting element 102 is a solid light-emitting element, and is, for example, a light-emitting diode (LED). It should be noted that although only one light-emitting element 102 is connected between terminal T1 and terminal T2 in FIG. 1, light-emitting elements 102 may be connected in series or parallel.

Lighting device 101 supplies light-emitting element 102 with a current modulated based on a visible light communication signal. Lighting device 101 includes DC power supply circuit 111, current control circuit 112, signal generation circuit 113, feedback circuit 114, and DC power supply control circuit 115.

DC power supply circuit 111 supplies light-emitting element 102 with substantially constant DC voltage V1 (first voltage) or a current. For example, DC power supply circuit 111 is a circuit which converts alternating-current (AC) power supplied by a commercial power source into DC power, and supplies a constant voltage using the converted DC power. DC power supply circuit 111 includes, for example, an AC/DC converter and a DC/DC converter.

Current control circuit 112 adjusts current ID flowing through light-emitting element 102 to a constant value. Signal generation circuit 113 generates control signal VS and supplies the generated control signal to current control circuit 112.

DC power supply control circuit 115 causes voltage V2 to be a constant value by controlling DC power supply circuit 111 based on voltage V2 at a node between light-emitting element 102 and current control circuit 112.

Feedback circuit 114 is connected between DC power supply control circuit 115 and the node between light-emitting element 102 and current control circuit 112.

[Configuration of and Operation by Current Control Circuit]

Figure 2:
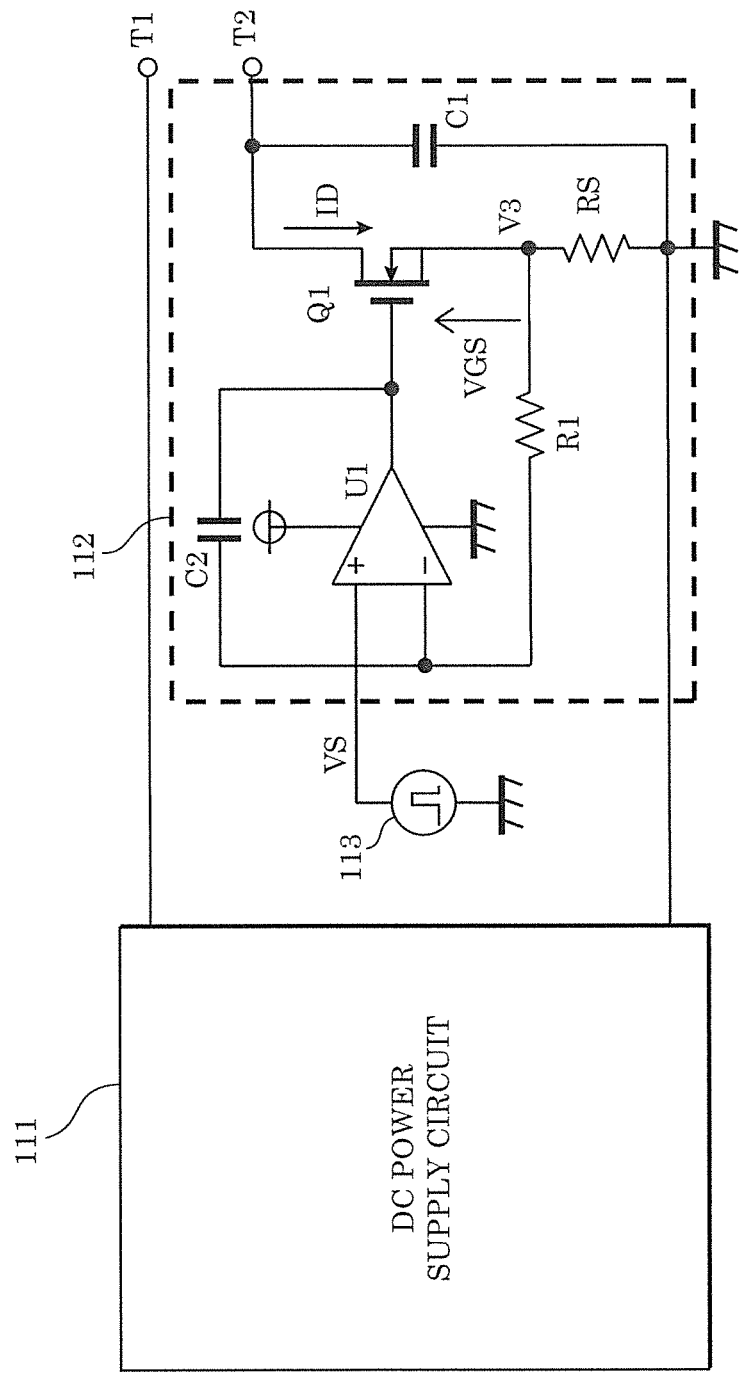
FIG. 2 is a diagram illustrating a configuration of a current control circuit according to Embodiment 1.

FIG. 2 is a diagram illustrating an exemplary configuration of current control circuit 112. Current control circuit 112 causes current ID flowing through light-emitting element 102 to become a constant current value corresponding to a voltage value of control signal VS. Current control circuit 112 includes current control element Q1, amplifier U1, resistors RS and R1, and capacitors C1 and C2.

Current control element Q1 is, for example, a switch such as a MOS transistor, and is connected in series to light-emitting element 102 via terminal T2. In addition, current control element Q1 is used to adjust current ID flowing through light-emitting element 102. Current control element Q1 operates in a saturation region, and current ID is controlled according to gate voltage Vgs.

It should be noted that current ID is a current flowing through light-emitting element 102, current control element Q1, and resistor RS as well as an output current of DC power supply circuit 111.

Resistor RS is a current detection element for detecting current ID flowing through light-emitting element 102 and current control element Q1, and is connected in series to current control element Q1.

Amplifier U1 is, for example, an operational amplifier (error amplifier), and amplifies a difference between current signal V3 detected by resistor RS and control signal VS. Specifically, amplifier U1 has an inverting input terminal connected via resistor R1 to a node between resistor RS and current control element Q1. Control signal VS is provided to a non-inverting input terminal of amplifier U1. Amplifier U1 has an output terminal connected to a gate terminal which is a control terminal of current control element Q1. In consequence, a current flowing through current control element Q1 is adjusted according to an output signal of amplifier U1.

Figure 3:
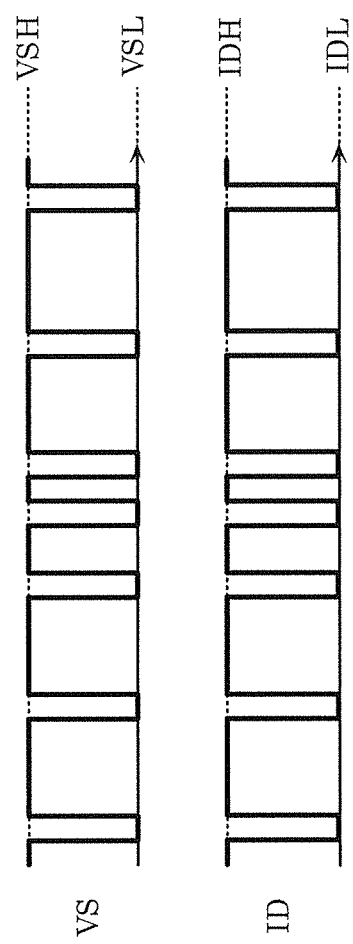
FIG. 3 is a timing diagram illustrating an operation performed by the luminaire according to Embodiment 1.

FIG. 3 is a diagram illustrating control signal VS and current ID. Control signal VS switches between a high level and a low level with timing based on a visible light communication signal, and has high-level voltage value VSH corresponding to a constant current instruction signal. Here, the constant current instruction signal is a signal corresponding to a value of a constant current flowing through light-emitting element 102, that is, a signal corresponding to a constant current value to be adjusted by current control element Q1. In other words, control signal VS is a signal obtained by superimposing the visible light communication signal on the constant current instruction signal.

Here, a voltage of the non-inverting input terminal of amplifier U1 and a voltage of the inverting input terminal of the same are made equal by controlling voltage VGS, by negatively feeding back current ID. In other words, since the controlling is performed to hold VS=ID×RS, current ID is calculated as ID=VS/RS. Moreover, because the visible light communication signal is superimposed on control signal VS, as illustrated in FIG. 3, current ID is also modulated in the same manner as control signal VS. Accordingly, the visible light communication signal is superimposed on light to be emitted by light-emitting element 102.

As above, current control circuit 112 controls current control element Q1 according to control signal VS. Specifically, current control circuit 112 turns on and off current control element Q1 based on visible light communication signal VC, and adjusts current ID flowing through light-emitting element 102 in a period in which current control element Q1 is on to constant current value IDH corresponding to constant current instruction signal VSH, by controlling current control element Q1.

For example, in FIG. 3, voltage low-level value VSL of control signal VS is zero, and at that time current value IDS is zero. It should be noted that voltage value VSL and current value IDL may not be zero. In other words, current control circuit 112 may switch current control element Q1 between a first state and a second state which differ in electrical impedance, based on visible light communication signal VC, and may adjust current ID flowing through light-emitting element 102 in a period in which current control element Q1 is in the first state to constant current value IDH corresponding to constant current instruction signal VSH, by controlling current control element Q1. Here, the first state is a state which has lower electrical impedance than the second state does and in which more current flows than in the second state.

Moreover, resistor R1 and capacitors C1 and C2 are phase compensating elements which prevent the oscillation of amplifier U1 and improve the stability of a feedback loop. Accordingly, instead of these elements, a circuit may be used which is obtained by connecting electrical impedance elements such as resistors and capacitors in series or parallel. In addition, at least one of resistor R1 and capacitors C1 and C2 need not be included in current control circuit 112.

As above, lighting device 101 according to Embodiment 1 performs a switching control for superimposing a visible light communication signal, using current control element Q1 for a constant current control. In other words, current control element Q1 for the constant current control is used for the superimposition of the visible light communication signal. Accordingly, compared to a case in which a switching element etc. is newly added for the superimposition of the visible light communication signal, it is possible to reduce an increase in components of circuits.

Figure 4:
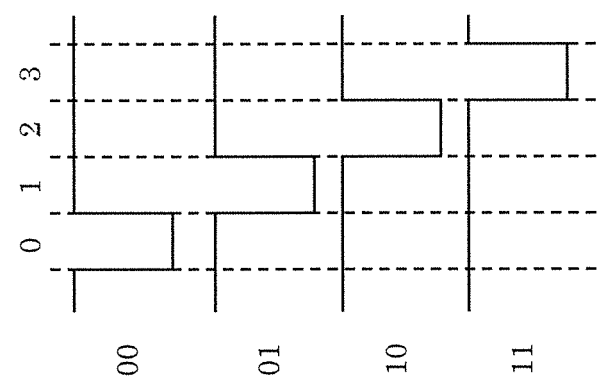
FIG. 4 is a diagram illustrating an example of a modulation method for a visible light communication signal according to Embodiment 1.

Moreover, in Embodiment 1, the visible light communication signal is generated which causes an average current value of current ID to be constant. Specifically, in order to reduce a change of a light output due to a change of a bit sequence, the visible light communication signal is generated using pulse-position modulation (PPM) having an N (an integer greater than or equal to two) value. For example, in 4 PPM, two bits are expressed by one symbol having a certain time length (see FIG. 4). This makes a ratio between a high interval and a low interval in the certain time length constant, and thus the average value of the output current becomes constant regardless of signals.

[Configurations of DC Power Supply Circuit and DC Power Supply Control Circuit]

DC power supply control circuit 115 causes voltage V2 to be a constant value by controlling DC power supply circuit 111 based on voltage V2 at node N1 between light-emitting element 102 and current control element Q1.

Figure 5:
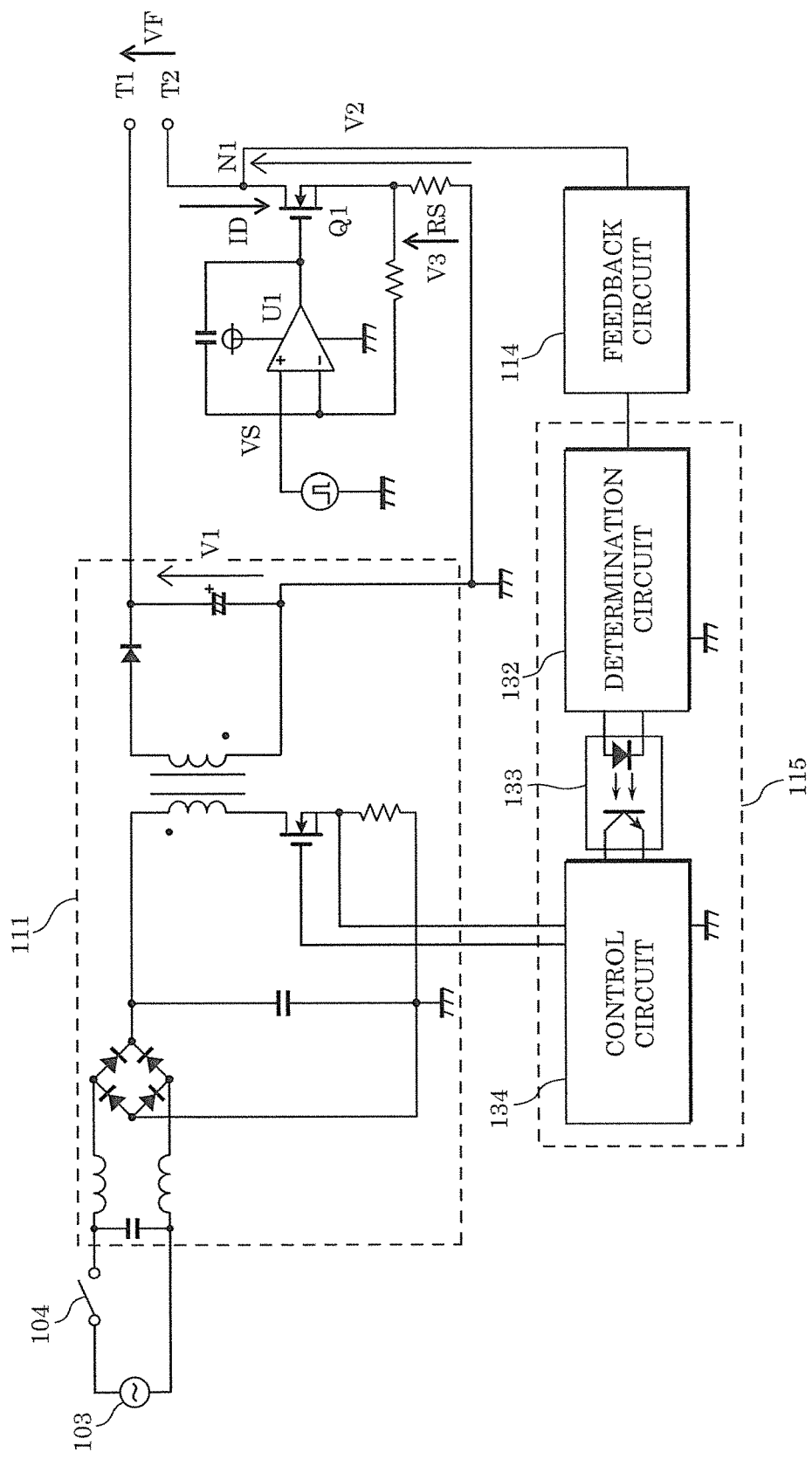
FIG. 5 is a diagram illustrating exemplary configurations of a direct-current (DC) power supply circuit and a DC power supply control circuit according to Embodiment 1.

FIG. 5 is a diagram illustrating exemplary configurations of DC power supply circuit 111 and DC power supply control circuit 115. It should be noted that FIG. 5 illustrates an exemplary configuration when DC power supply circuit 111 includes a flyback circuit.

As illustrated in FIG. 5, DC power supply control circuit 115 includes determination circuit 132, photocoupler 133, and control circuit 134. Moreover, DC power supply circuit 111 is connected to AC commercial power source 103 via switch 104 such as a wall switch.

DC power supply circuit 111 converts AC power supplied by commercial power source 103 into DC power.

Control circuit 134 makes voltage V2 constant by controlling a primary switching element of DC power supply circuit 111. Here, the term constant refers to making an average current per predetermined period constant which differs from the above-described constant current control by current control circuit 112 in time constant.

Determination circuit 132 is a circuit which makes output voltage V1 of DC power supply circuit 111 substantially constant by feeding back voltage V2 on a secondary side to control circuit 134. Determination circuit 132 transmits a signal corresponding to voltage V2 to control circuit 134 via photocoupler 133.

With the above configuration, DC power supply circuit 111 causes voltage V2 (second voltage) at node N1 (first node) between light-emitting element 102 and current control element Q1 to be a constant value by supplying voltage V1 (first voltage). Accordingly, while a forward voltage having a high load is dealt with, a loss in current control element Q1 can be kept to a minimum. Here, a load voltage (forward voltage) is constant, and thus voltage V1 becomes constant if voltage V2 is constant.

In particular, when input power of at least 25 W is used, it is desirable that high-frequency current limiting be dealt with by performing a power factor correction (PFC) control. For example, the above-described circuit can be used in designing an AC/DC converter corresponding to a broad input voltage in a range of from, for example, 100 V to 242 V.

[Problem]

In the above-described circuit configuration, in the case where a visible light communication signal is modulated, when control signal VS is at a low level (e.g., 0 V), current control element Q1 is turned off.

Figure 6:
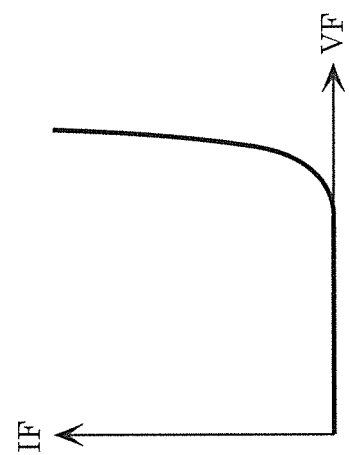
FIG. 6 is a graph illustrating voltage-current characteristics of a light-emitting element according to Embodiment 1.

Even when current control element Q1 is off, that is, when current ID is 0, as illustrated in FIG. 6, forward characteristics of light-emitting element 102, a load, allow a minute current region to have a forward voltage. Accordingly, a leakage current of current control element Q1, capacitance C1, and components constituting other circuits causes voltage VF at the both ends of light-emitting element 102 not to be 0 but to have a certain voltage value. Moreover, since the value of voltage VF at this time varies due to a variation in component and an environment such as a temperature and a humidity, the value cannot be known in advance. As a result, it is not possible to accurately cause voltage V1 and voltage V2 to be a predetermined voltage value.

In view of this, in Embodiment 1, feedback circuit 114 supplies a predetermined voltage to DC power supply control circuit 115 in a period in which current control element Q1 is off. With this, since a voltage value to be fed back in the period in which current control element Q1 is off can be known in advance, a highly accurate constant voltage control can be achieved.

[Configurations of Determination Circuit and Feedback Circuit]

Figure 7:
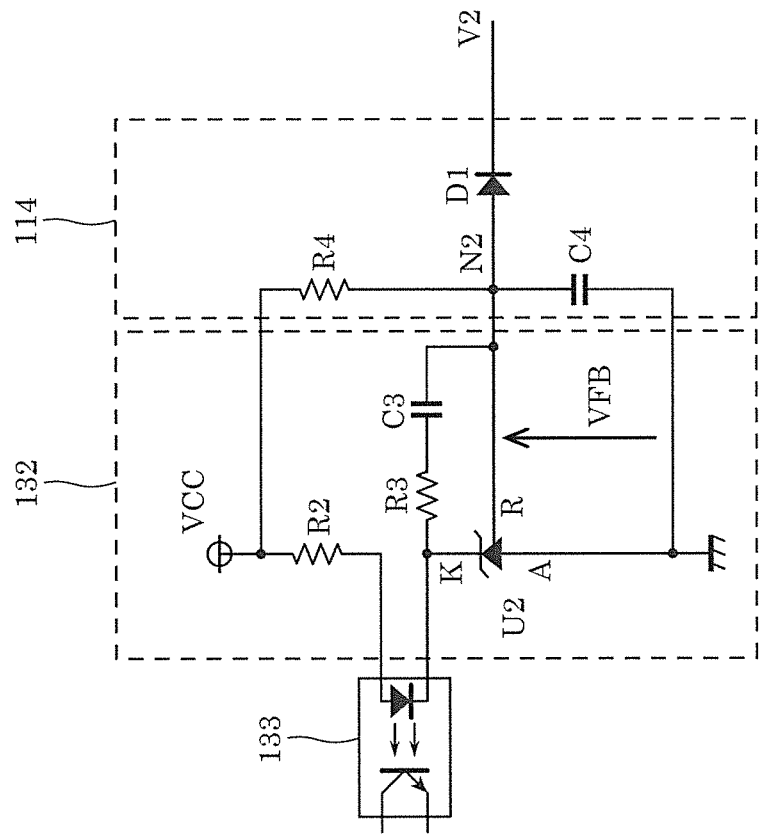
FIG. 7 is a diagram illustrating exemplary configurations of a feedback circuit and a determination circuit according to Embodiment 1.

FIG. 7 is a diagram illustrating exemplary configurations of determination circuit 132 and feedback circuit 114. Determination circuit 132 includes shunt regulator U2, resistors R2 and R3, and capacitance C3.

Shunt regulator U2 is a circuit which determines whether input voltage VFB (voltage of R terminal) is higher than reference voltage Vref that is predetermined. Specifically, shunt regulator U2 amplifies a difference between input voltage VFB (voltage of R terminal) and reference voltage Vref.

Figure 8:
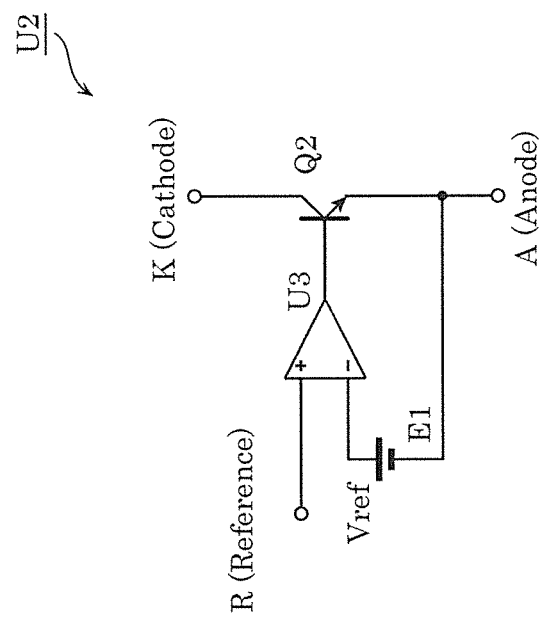
FIG. 8 is a diagram illustrating an exemplary configuration of a shunt regulator according to Embodiment 1.

FIG. 8 is a diagram illustrating an exemplary configuration of shunt regulator U2. As illustrated in FIG. 8, shunt regulator U2 includes amplifier U3, transistor Q2, and reference voltage source E1. With the configuration illustrated in FIG. 8, when voltage VFB of R terminal is lower than reference voltage Vref supplied by reference voltage source E1, transistor Q2 is turned off. Moreover, when voltage VFB is higher than reference voltage Vref, transistor Q2 is turned on. Consequently, a signal indicating whether voltage VFB is higher than reference voltage Vref is transmitted to control circuit 134 via photocoupler 133. Furthermore, resistor R3 and capacitor C3 are phase compensating elements.

Feedback circuit 114 supplies a predetermined voltage to DC power supply control circuit 115 in a period in which current control element Q1 is off. Feedback circuit 114 includes diode D1, resistor R4, and capacitor C4.

Diode D1 is connected in series between node N1 and DC power supply control circuit 115 (more specifically determination circuit 132).

Resistor R4 is connected in series between voltage source VCC and node N2 (second node) between diode D1 and DC power supply control circuit 115 (more specifically determination circuit 132). Capacitor C4 is connected to node N2.

[Operation by Feedback Circuit]

Figure 9:
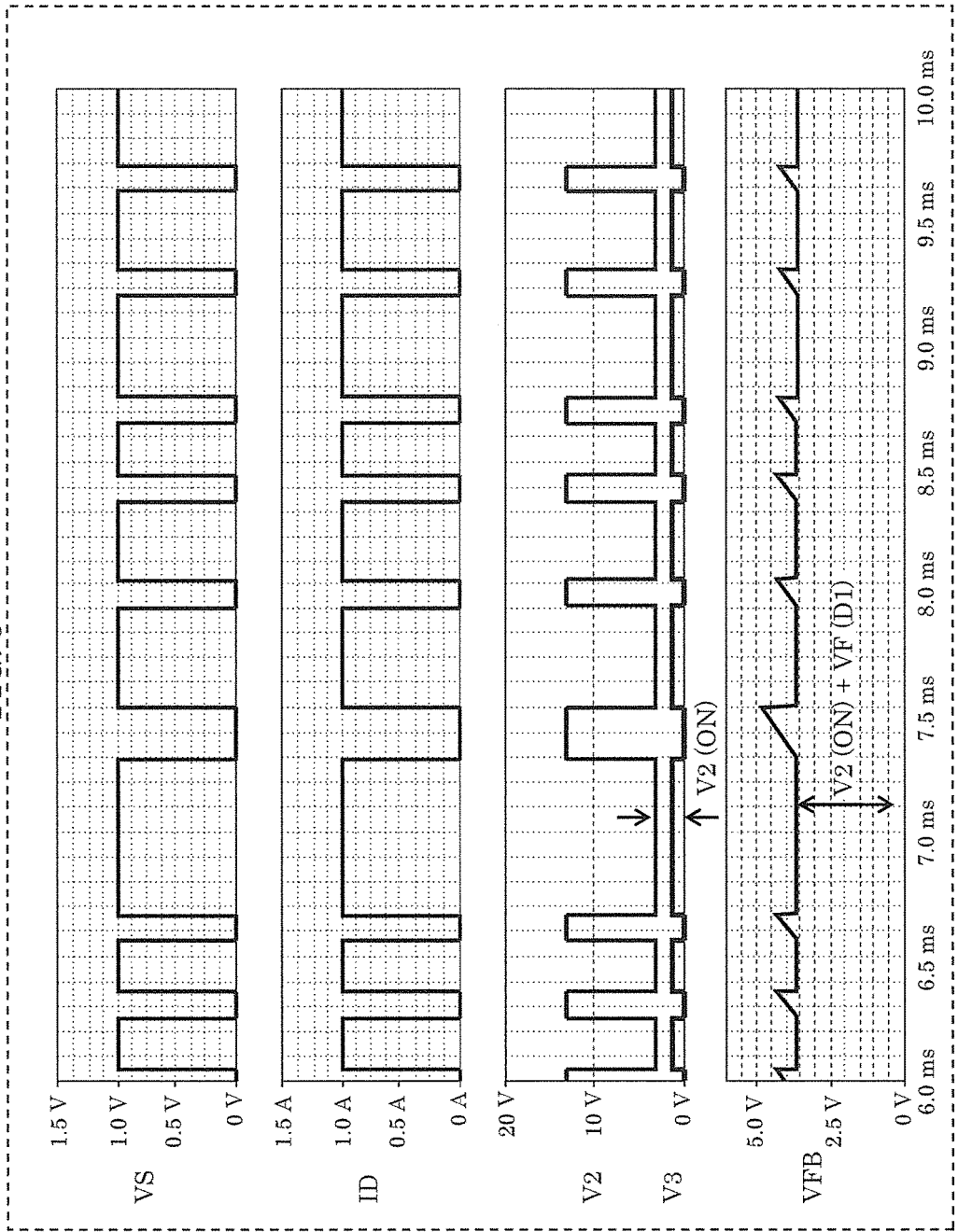
FIG. 9 is a timing diagram illustrating an operation performed by the luminaire according to Embodiment 1.

FIG. 9 is a timing diagram illustrating an exemplary operation performed by feedback circuit 114.

Since voltage V2 becomes low when control signal VS is at a high level and current control element Q1 is on, diode D1 is in the on state. Accordingly, VFB=V2 is held.

In contrast, since voltage V2 becomes high when control signal VS is at a low level and current control element Q1 is off, diode D1 is turned off. In this manner, voltage V2 is cut off by diode D1 in an off period of current control element Q1 in which voltage V2 becomes inconstant. In other words, since voltage V2 becomes high in the off period of current control element Q1, diode D1 is caused to avoid applying voltage V2 to determination circuit 132.

Moreover, at this time, electrical charges are accumulated in capacitor C4 via resistor R4.

Furthermore, phase compensating elements (e.g., resistor R3 and capacitor C3) which adjust a response speed of a feedback system set a response speed to be sufficiently slower than the bit rate of a visible light communication signal. This causes an average value of a waveform of voltage VFB to be reference voltage Vref.

Here, as described above, examples of the visible light communication signal include a signal modulated using 4-PPM. In 4-PPM, the ratio of a high-level interval to a low-level interval in an entire signal is always 3:1.

Accordingly, voltage VFB in the off period of current control element Q1 is expressed by the following (Equation 1).

[Math. 1]

$$VFB = \frac{VCC - V2(ON)}{R4 \cdot C4} \cdot \Delta t \cdot \frac{1}{2} \cdot \frac{1}{4} + V2(ON) + VF(D1) \quad \text{(Equation 1)}$$

Here, Δt represents a bit width of 1 bit of a visible light communication signal, V2(ON) represents a voltage value of voltage V2 when current control element Q1 is on, and VF(D1) represents a forward voltage of diode D1.

Moreover, the first term is multiplied by ½ because a triangle waveform is superimposed, and the first term is multiplied by ¼ because 4-PPM is used.

Output voltage V1 of DC power supply circuit 111 is adjusted such that voltage V2(ON) calculated from the equation is achieved. In other words, a constant voltage control with desired voltage V2(ON) can be achieved by setting reference voltage Vref equal to VFB obtained by substituting desired voltage V2(ON) in (Equation 1).

As stated above, in Embodiment 1, feedback circuit 114 is capable of supplying the predetermined voltage to DC power supply control circuit 115 when current control element Q1 is off. This makes it possible to achieve the highly accurate constant voltage control because voltage VFB in the off period of current control element Q1 can be known in advance. Accordingly, lighting device 101 makes it possible to improve the operation stability.

Moreover, voltage V2(ON) is caused to be constant even when light-emitting element 102 having a different forward voltage is connected. Accordingly, it is possible to reduce the loss in current control element Q1.

[Operation Waveform]

Figure 10:
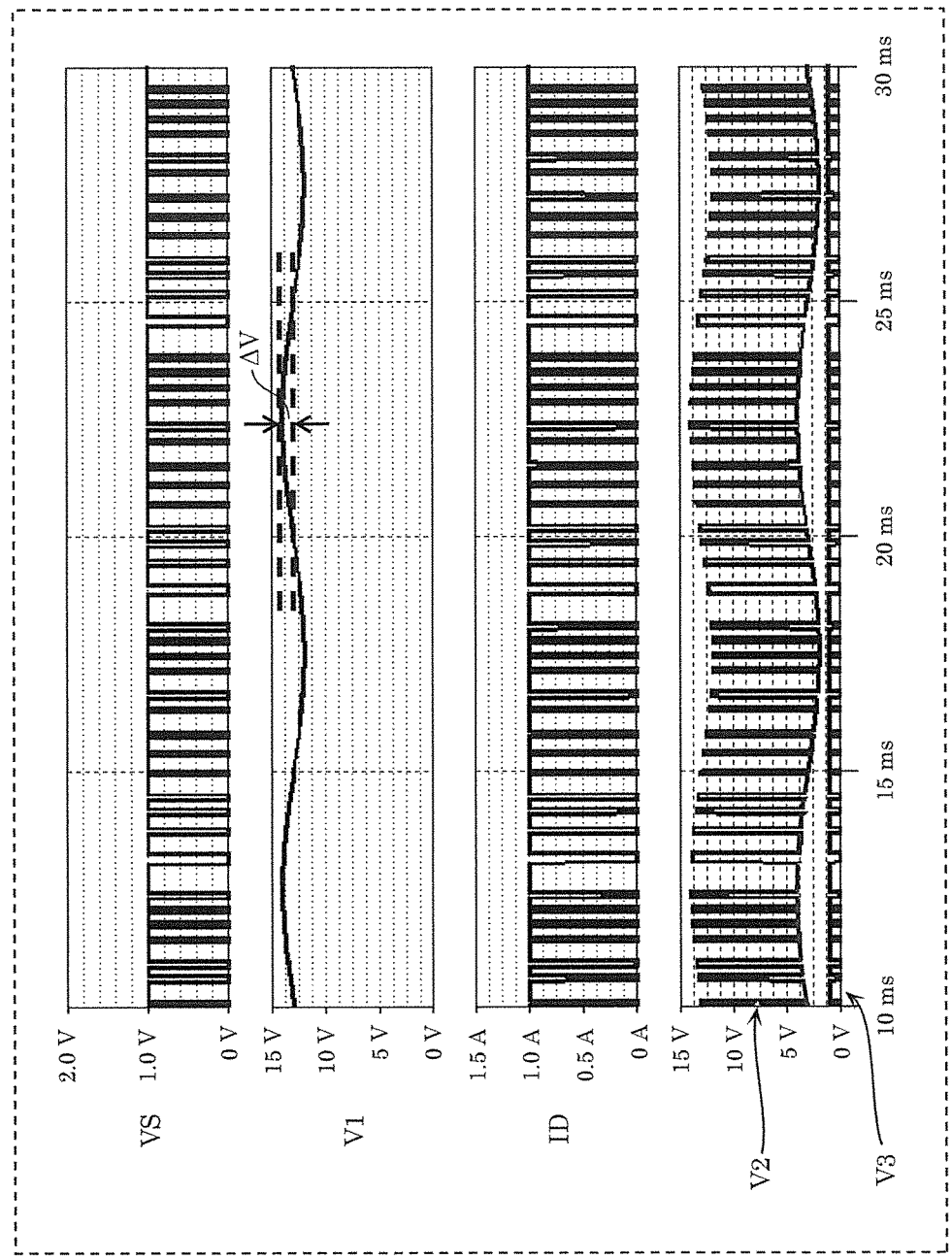
FIG. 10 is a timing diagram illustrating an operation performed by the luminaire according to Embodiment 1.

FIG. 10 is a graph illustrating an operation waveform of each signal. Voltage V1 includes a pulsating voltage having twice as many frequency components as an AC signal of commercial power source 103. Voltage V2 also includes the pulsating voltage. Here, because the pulsating voltage is absorbed into a drain voltage of current control element Q1 that is an MOS transistor, it is possible to reduce the absorption of the pulsating voltage into current ID. As a result, it is possible to reduce a lighting flicker and a video flicker. In addition, the lighting flicker becomes unperceivable to the human eyes by modulating a visible light communication signal with a sufficiently high frequency (e.g., at least 1 kHz).

It should be noted that in order to absorb the pulsating voltage as above, voltage V2 when current control element Q1 is conducted needs to be greater than amplitude ΔV of the pulsating voltages of voltages V1 and V2. In other words, DC power supply circuit 111 supplies voltage V1 which causes voltage V2 to be greater than amplitude ΔV of the pulsating voltage of voltage V1.

[Variation 1 of Feedback Circuit]

Figure 11:
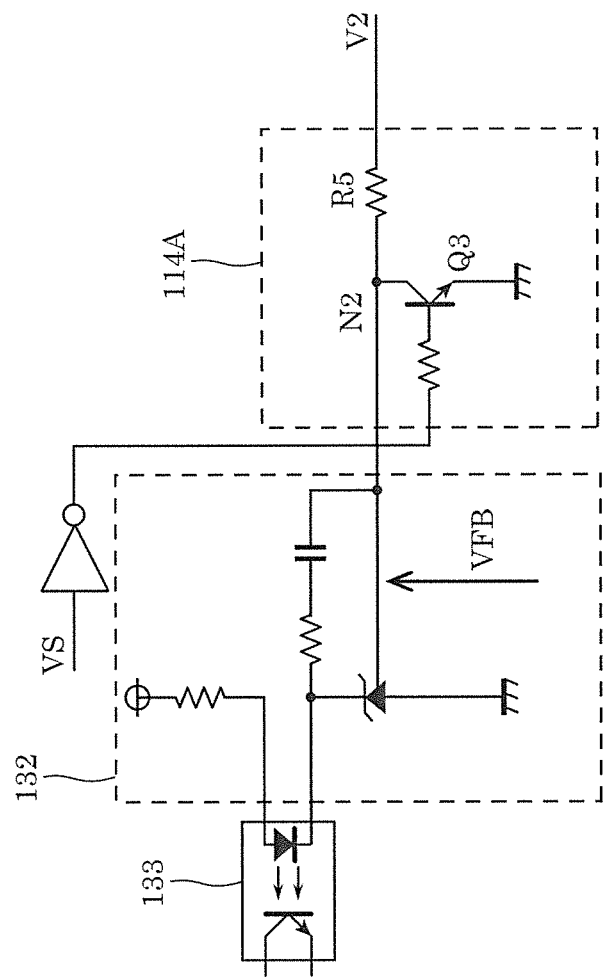
FIG. 11 is a diagram illustrating exemplary configurations of a feedback circuit and a determination circuit according to Variation 1 of Embodiment 1.
Figure 12:
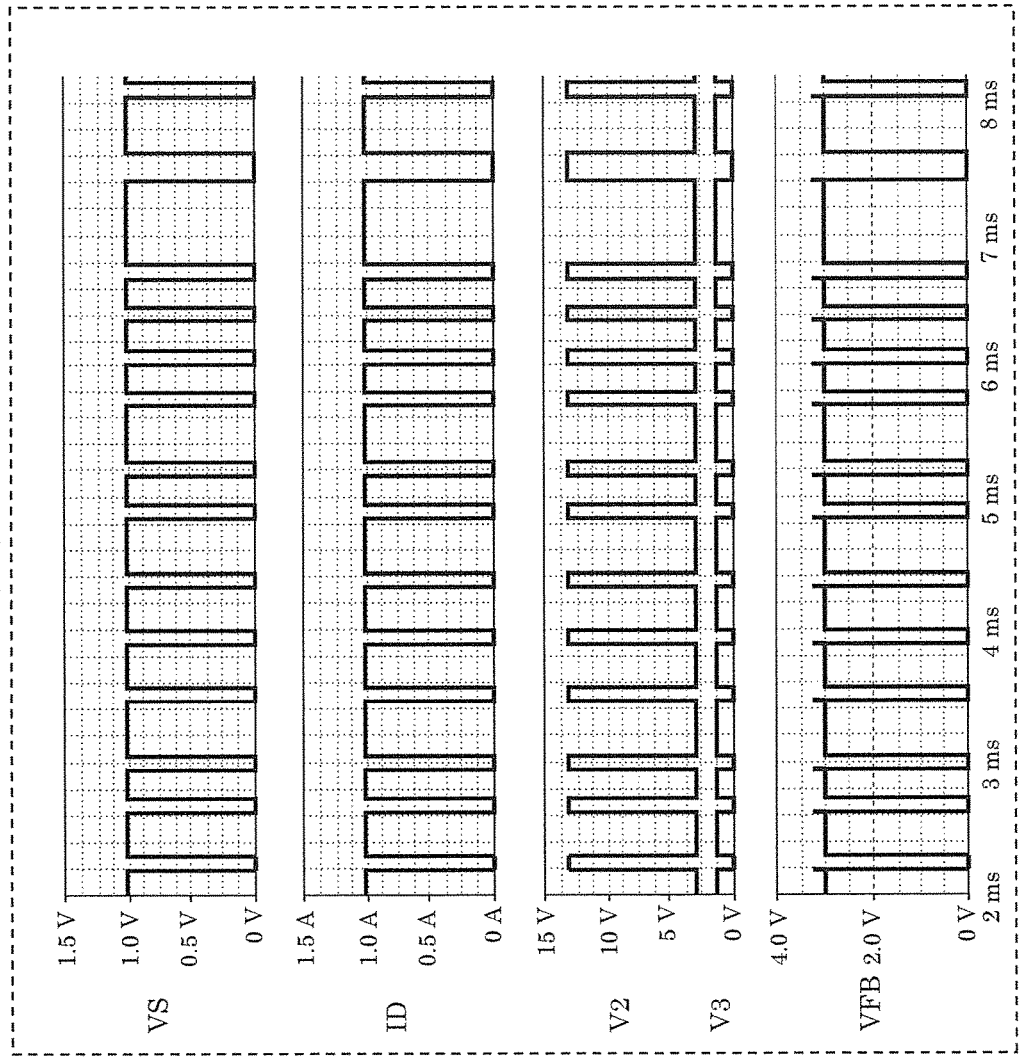
FIG. 12 is a timing diagram illustrating an operation performed by a luminaire according to Variation 1 of Embodiment 1.

FIG. 11 is a diagram illustrating an exemplary configuration of feedback circuit 114A that is a variation of feedback circuit 114. FIG. 12 is a timing diagram illustrating an exemplary operation performed by feedback circuit 114A.

Feedback circuit 114A illustrated in FIG. 11 includes transistor Q3 and resistor R5. Resistor R5 is connected in series between node N1 (first node) and DC power supply control circuit 115 (more specifically determination circuit 132). Transistor Q3 is connected between a ground potential (GND) and node N2 (second node) between resistor R5 and DC power supply control circuit 115 (more specifically determination circuit 132). Transistor Q3 is turned on in a period in which current control element Q1 is off, and is turned off in a period in which current control element Q1 is on. For example, as illustrated in FIG. 11, an inversion signal of control signal VS is transmitted to the base of transistor Q3.

With this configuration, transistor Q2 is turned off in the on period of current control element Q1. Accordingly, VFB=V2 is held.

In contrast, in the off period of current control element Q1, transistor Q2 is turned on, and voltage VFB becomes 0. It should be noted that resistor R5 is caused to have a sufficiently large value such that a current flowing in the off period of current control element Q1 becomes smaller.

In 4-PPM, the ratio of a high-level interval to a low-level interval in an entire signal is always 3:1. Accordingly, voltage VFB in the off period of current control element Q1 is expressed by the following (Equation 2).

[Math. 2]

$$VFB = \frac{3 \cdot V2(ON)}{4} \quad \text{(Equation 2)}$$

Output voltage V1 of DC power supply circuit 111 is adjusted such that voltage V2(ON) calculated from the equation is achieved. In other words, a constant voltage control with desired voltage V2(ON) can be achieved by setting reference voltage Vref equal to VFB obtained by substituting desired voltage V2(ON) in (Equation 2).

As stated above, feedback circuit 114A is capable of supplying the predetermined voltage to DC power supply control circuit 115 when current control element Q1 is off. This makes it possible to achieve the highly accurate constant voltage control because voltage VFB in the off period of current control element Q1 can be known in advance.

[Variation 2 of Feedback Circuit]

Figure 13:
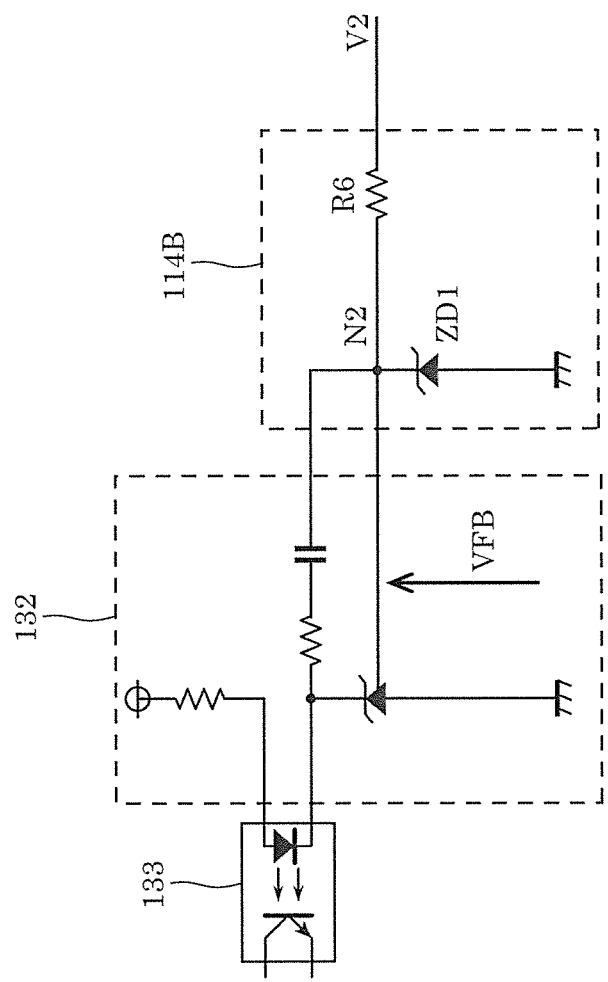
FIG. 13 is a diagram illustrating exemplary configurations of a feedback circuit and a determination circuit according to Variation 2 of Embodiment 1.
Figure 14:
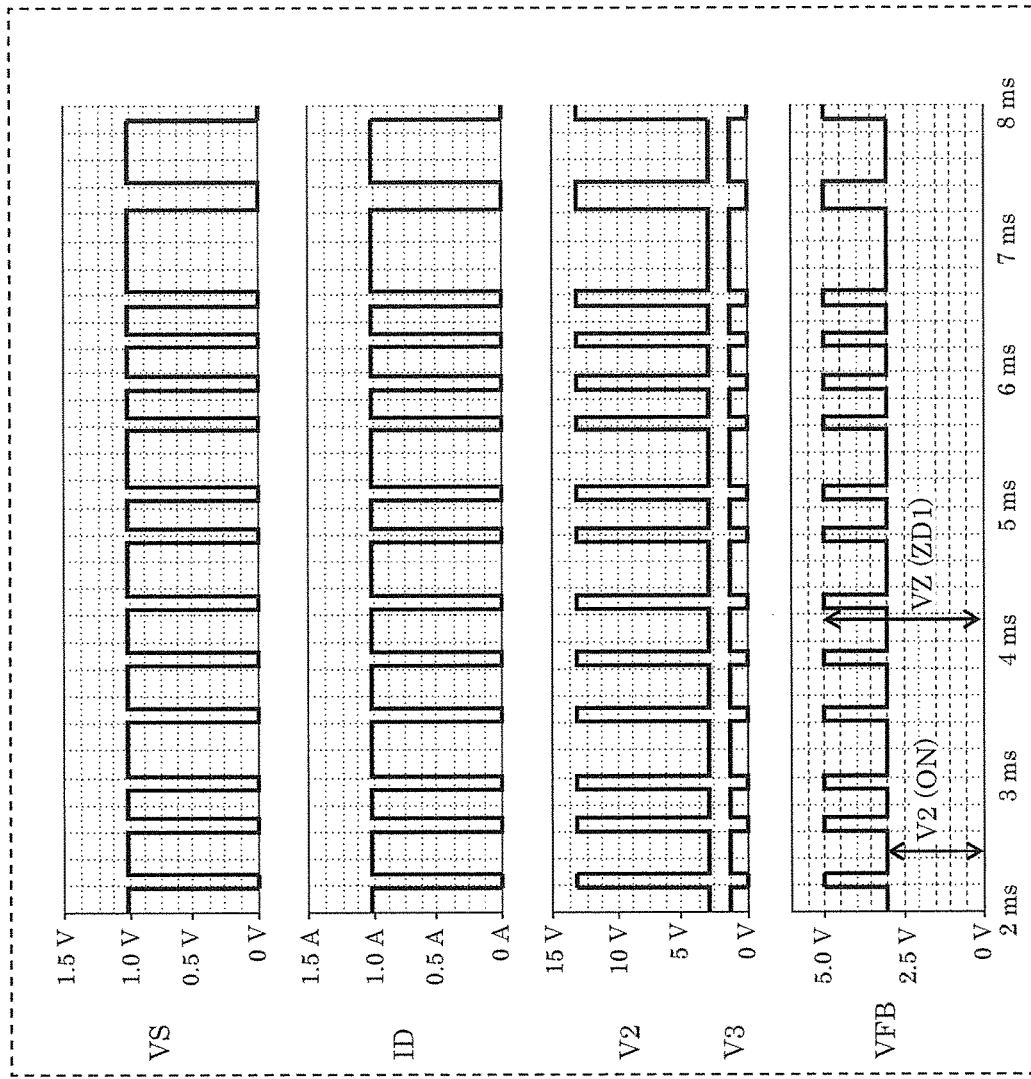
FIG. 14 is a timing diagram illustrating an operation performed by a luminaire according to Variation 2 of Embodiment 1.

FIG. 13 is a diagram illustrating an exemplary configuration of feedback circuit 114B that is a variation of feedback circuit 114. FIG. 14 is a timing diagram illustrating an exemplary operation performed by feedback circuit 114B.

Feedback circuit 114B illustrated in FIG. 13 includes diode ZD1 and resistor R6. Resistor R6 is connected in series between node N1 (first node) and DC power supply control circuit 115 (more specifically determination circuit 132). Diode ZD1 is a Zener diode and is connected between a ground potential (GND) and node N2 (second node) between resistor R6 and DC power supply control circuit 115 (more specifically determination circuit 132).

With this configuration, in the on period of current control element Q1, diode ZD1 is turned off because voltage V2 is low. Accordingly, VFB=V2 is held.

In contrast, in the off period of current control element Q1, diode ZD1 is turned on because voltage V2 is high, and voltage VFB becomes equal to Zener voltage VZ(ZD1) of diode ZD1. It should be noted that resistor R6 is caused to have a sufficiently large value such that a current flowing in the off period of current control element Q1 becomes smaller.

In 4-PPM, the ratio of a high-level interval to a low-level interval in an entire signal is always 3:1. Accordingly, voltage VFB in the off period of current control element Q1 is expressed by the following (Equation 3).

[Math. 3]

$$VFB = \frac{3 \cdot V2(ON) + VZ(ZD1)}{4} \quad \text{(Equation 3)}$$

Output voltage V1 of DC power supply circuit 111 is adjusted such that voltage V2(ON) calculated from the equation is achieved. In other words, a constant voltage control with desired voltage V2(ON) can be achieved by setting reference voltage Vref equal to VFB obtained by substituting desired voltage V2(ON) in (Equation 3).

As stated above, feedback circuit 114B is capable of supplying the predetermined voltage to DC power supply control circuit 115 when current control element Q1 is off. This makes it possible to achieve the highly accurate constant voltage control because voltage VFB in the off period of current control element Q1 can be known in advance.

[Other Variations]

DC power supply circuit 111 is not limited to a flyback converter. For example, DC power supply circuit 111 may be a buck converter, a boost converter, a single-ended primary-inductor converter (SEPIC), or a non-isolated converter such as a buck-boost converter. When the non-isolated converter is used, an isolator such as photocoupler 133 need not be included.

Moreover, part or all of the processes of DC power supply control circuit 115 and feedback circuit 114 may be achieved through a digital control by a microcomputer or the like. In this case, feedback voltage VFB is inputted to an A/D converter input terminal of the above microcomputer. Furthermore, parts equivalent to the above reference voltage source, amplifier, and a peripheral circuit of the amplifier are achieved as processes within the microcomputer. Moreover, it is possible to reduce the number of components by the same microcomputer generating a visible light communication signal.

Embodiment 2

[Problem]

The configuration of aforementioned Embodiment 1 may cause output voltage V1 of DC power supply circuit 111 to be high when a variation in voltage or instantaneous power failure of AC commercial power source 103, or a sudden change in voltage etc. caused by the operation or chattering of switch 104, occurs in DC power supply circuit 111 connected to commercial power source 103.

This is because a response speed of DC power supply control circuit 115 is slow. Specifically, the phase compensating elements (e.g., resistor R3 and capacitor C3) of DC power supply control circuit 115 set the response speed of DC power supply control circuit 115 to be sufficiently slower than a frequency of a visible light communication signal. Moreover, when a power factor correction (PFC) operation is performed, the response speed of DC power supply control circuit 115 is set to be sufficiently slower than an AC frequency. As a result, it is possible to reduce high-frequency current distortion and improve a power factor. For the above reasons, it is not possible to increase the response speed of DC power source control circuit 115.

Moreover, when output voltage V1 of DC power supply circuit 111 becomes high, V2=V1−VF is applied to current control element Q1 and resistor RS. Here, voltage VF is a voltage between both terminals of light-emitting element 102. Furthermore, a power stress of ID×VDS occurs in current control element Q1 because current control circuit 112 causes current ID flowing through light-emitting element 102 to be constant. Here, VDS is a drain-source voltage of current control element Q1.

When voltage V2 becomes high as described above, an excessive stress is applied to current control element Q1, and current control element Q1 may break down.

In Embodiment 2, a configuration which reduces a power stress will be described.

[Configurations of DC Power Supply Control Circuit and Feedback Circuits]

Figure 15:
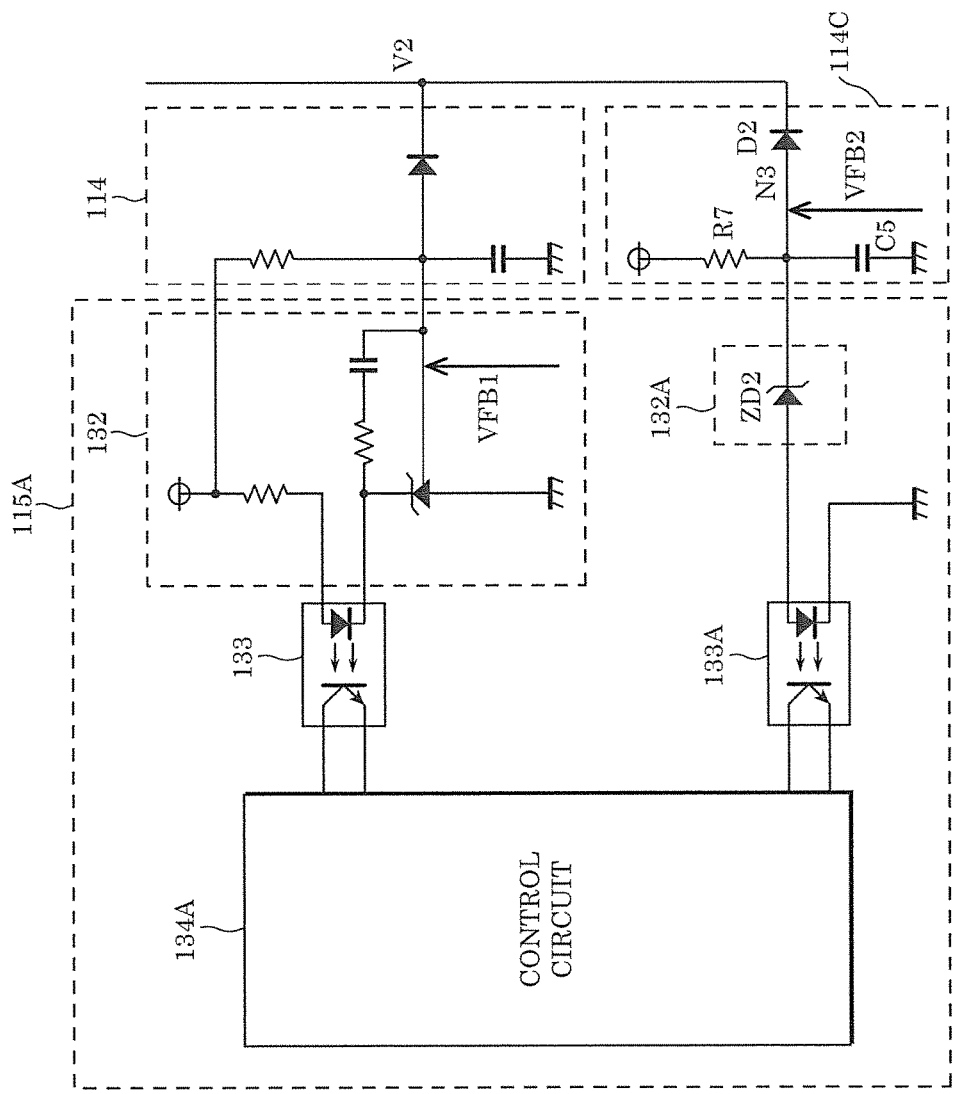
FIG. 15 is a diagram illustrating exemplary configurations of a DC power supply circuit and a feedback circuit according to Embodiment 2.

FIG. 15 is a diagram illustrating configurations of DC power supply control circuit 115A and feedback circuits 114 and 114C according to Embodiment 2. The configuration of DC power supply control circuit 115A in Embodiment 2 is different from that of DC power supply control circuit 115 in aforementioned Embodiment 1. Moreover, lighting device 101 includes feedback circuit 114C in addition to feedback circuit 114.

DC power supply control circuit 115A includes determination circuit 132A and photocoupler 133A in addition to the configuration of DC power supply control circuit 115. Moreover, control circuit 134A differs from control circuit 134 in function.

Feedback circuit 114 and determination circuit 132 have the same configurations as in Embodiment 1. In other words, as stated above, these circuits cause voltage V2 to be constant at ordinary times. Moreover, the phase compensating elements (e.g., resistor R3 and capacitor C3) set a response speed of the circuits to be slow. Specifically, voltage VFB1 is caused to be reference voltage Vref.

Feedback circuit 114C is connected between node N1 and DC power supply control circuit 115A (more specifically determination circuit 132A), and supplies voltage V2 to DC power supply control circuit 115A (more specifically determination circuit 132A). Moreover, feedback circuit 114C supplies a predetermined voltage to DC power supply control circuit 115A (more specifically determination circuit 132A) in a period in which current control element Q1 is off.

Feedback circuit 114C has the same configuration and function as feedback circuit 114, and includes diode D2, resistor R7, and capacitor C5. Diode D2 is connected in series between node N1 and DC power supply control circuit 115A (more specifically determination circuit 132A). Resistor R7 is connected in series between voltage source VCC and node N3 between diode D2 and DC power supply control circuit 115A (more specifically determination circuit 132A). Capacitor C5 is connected to node N3.

Determination circuit 132A determines whether voltage VFB2 supplied by feedback circuit 114C is higher than a second reference voltage. In other words, determination circuit 132A includes diode ZD2. Diode ZD2 is a Zener diode and is connected in series between node N3 and photocoupler 133A. Here, the second reference voltage is a voltage higher than reference voltage Vref in determination circuit 132, and is set based on a Zener voltage of diode ZD2.

With this configuration, feedback circuit 114C operates when voltage V2 is higher than the second reference voltage, and does not operate when voltage V2 is lower than the second reference voltage. Moreover, these circuits detect that voltage V2 has temporarily become high, and transmit the detection result to control circuit 134A via photocoupler 133A.

Furthermore, determination circuit 132A includes no phase compensating element for improving the operation stability because determination circuit 132A does not operate at ordinary times. Accordingly, a response speed of determination circuit 132A is faster than that of determination circuit 132.

Control circuit 134A controls DC power supply circuit 111 based on a signal transmitted by determination circuit 132A, in addition to the function of control circuit 134. Specifically, when determination circuit 132A determines that voltage V2 is higher than the second reference voltage, control circuit 134A causes DC power supply circuit 111 to reduce voltage V1.

In other words, during steady operation, diode ZD2 is in the off state, and photocoupler 133A does not operate. In contrast, when voltage V1 becomes high, voltage V2(ON) when current control element Q1 is turned on becomes high. Consequently, voltage VFB2 becomes high, diode ZD2 is turned on, and photocoupler 133A is driven. When photocoupler 133A is driven, control circuit 134A performs a control for reducing voltage V1. It should be noted that, instead of reducing voltage V1, control circuit 134A may suspend DC power supply circuit 111 and subsequently restart DC power supply circuit 111.

As above, in Embodiment 2, DC power supply control circuit 115A includes determination circuit 132A having a fast response speed, in addition to determination circuit 132. This makes it possible to reduce voltage V1 when voltage V1 becomes high due to a variation in voltage or instantaneous power failure of commercial power source 103, or a sudden change in voltage etc. caused by the operation or chattering of switch 104. Accordingly, it is possible to reduce the occurrence of an excessive stress in an element.

[Variation of DC Power Supply Control Circuit]

Figure 16:
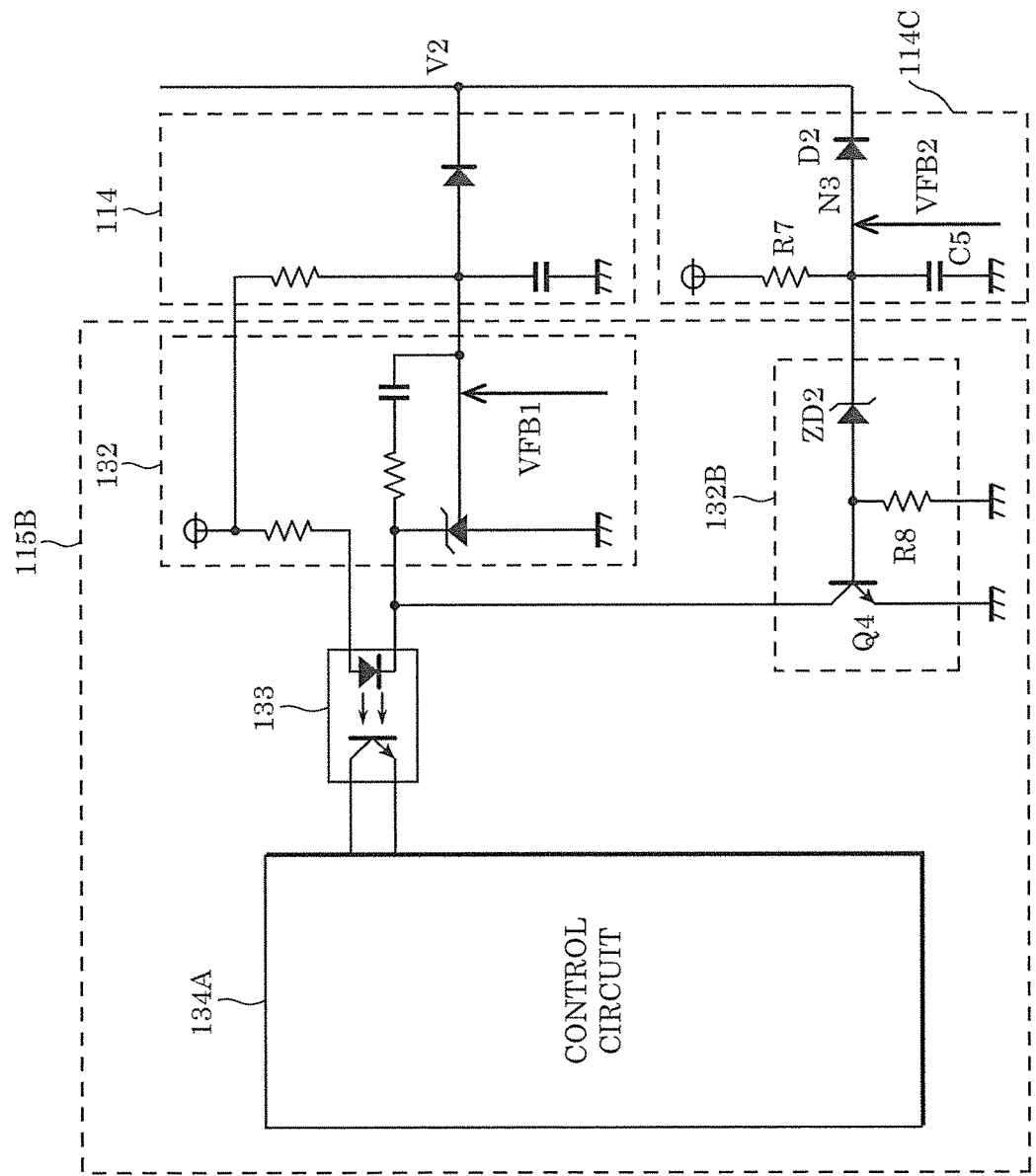
FIG. 16 is a diagram illustrating exemplary configurations of a DC power supply circuit and a feedback circuit according to a variation of Embodiment 2.

FIG. 16 is a diagram illustrating a configuration of DC power supply control circuit 115B that is a variation of DC power supply control circuit 115A. It should be noted that feedback circuits 114 and 114C have the same configurations as in FIG. 15.

In DC power supply control circuit 115B illustrated in FIG. 16, determination circuit 132B has a configuration different from that of determination circuit 132A. In addition, in DC power supply control circuit 115B, single photocoupler 133 transmits both a determination result of determination circuit 132 and a determination result of determination circuit 132B to control circuit 134A.

Specifically, determination circuit 132B further includes transistor Q4 and resistor R8 in addition to the configuration of determination circuit 132A in FIG. 15. When voltage VFB2 exceeds the second reference voltage, transistor Q4 is turned on and photocoupler 133 operates.

Control circuit 134A controls DC power supply circuit 111 based on a signal transmitted by photocoupler 133. Specifically, control circuit 134A causes DC power supply circuit 111 to reduce voltage V1 when a drive current of photocoupler 133 becomes large. Accordingly, determination circuit 132B immediately drives photocoupler 133 when voltage V1 becomes an excessive voltage, which reduces an increase in voltage V1.

It should be noted that although FIG. 15 and FIG. 16 have illustrated the examples in which the circuit configuration illustrated in FIG. 7 is used for feedback circuits 114 and 114C, feedback circuit 114A illustrated in FIG. 11 or feedback circuit 114B illustrated in FIG. 13 may be used.

Moreover, although the examples have been described in aforementioned Embodiment 1 and Embodiment 2 in which single current control element Q1 performs the constant current control and the superimposition of the visible light communication signal, a different element may perform the constant current control and the superimposition of the visible light communication signal. For example, among a transistor and a switch connected in series to each other, the constant current control may be performed using the transistor, and the superimposition of the visible light communication signal may be performed using the switch. In addition, the constant current control is not performed, and only the superimposition of the visible light communication signal may be performed.

Embodiment 3

Luminaire 100 and signboard 150 including lighting device 101 described in Embodiment 1 or Embodiment 2 will be described in Embodiment 3.

[Example of Luminaire]

Figure 17:
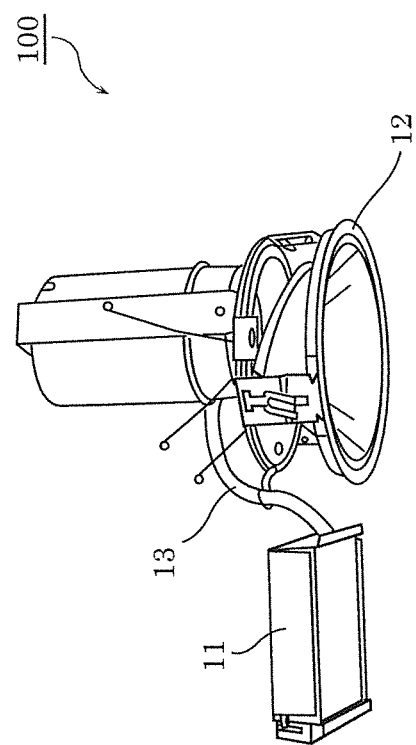
FIG. 17 is a schematic diagram illustrating an appearance of a luminaire according to Embodiment 3.

FIG. 17 is an external view of luminaire 100 described in Embodiment 1 or Embodiment 2. FIG. 17 illustrates an example in which luminaire 100 is applied to a downlight. Luminaire 100 includes circuit box 11, lamp body 12, and wire 13.

Circuit box 11 houses above-described lighting device 101, and an LED (light-emitting element 102) is attached to lamp body 12. Moreover, wire 13 electrically connects circuit box 11 and lamp body 12.

Figure 18:
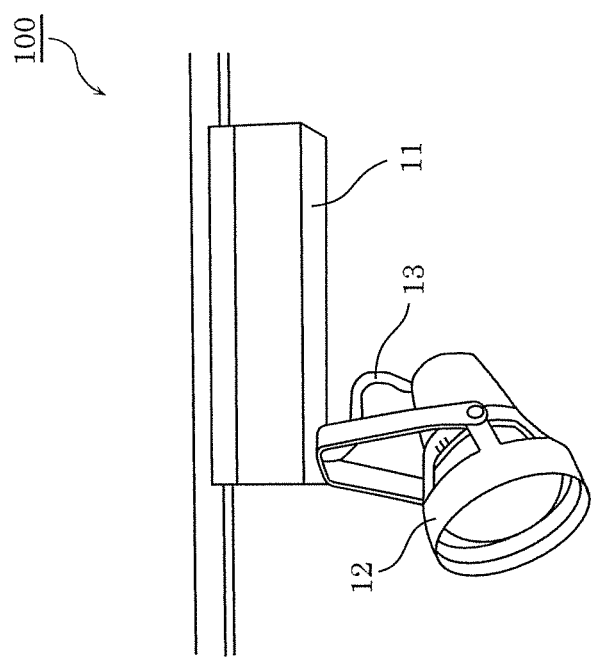
FIG. 18 is a schematic diagram illustrating an appearance of the luminaire according to Embodiment 3.

It should be noted that luminaire 100 may be applied to another luminaire such as a spotlight illustrated in FIG. 18.

[Example of Signboard]

Figure 19:
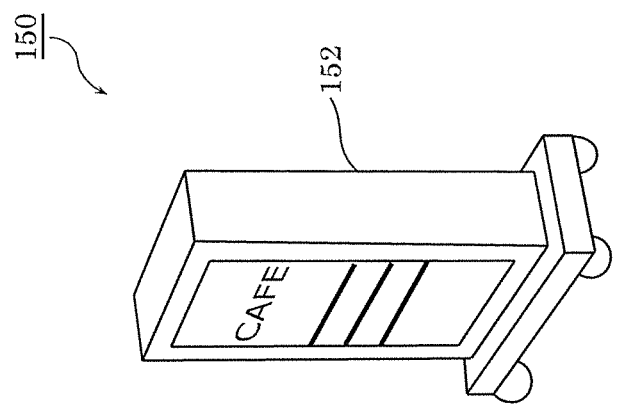
FIG. 19 is a schematic diagram illustrating an appearance of a signboard according to Embodiment 3.

FIG. 19 is an external view of signboard 150 including sign housing 152 incorporating therein lighting device 101 and light-emitting element 102 described in Embodiment 1 or Embodiment 2. For example, as illustrated in FIG. 19, lighting device 101 is applied to signboard 150 for use in a commercial facility or a store. It should be noted that a type of signboard 150 including lighting device 101 is not limited to the above type. For example, examples of signboard 150 may include a station sign, an information board, and an advertising sign for use in a station or the like.

[Other Variations]

The above-described type of the switching element is an example, and the present disclosure is not limited to this. For example, the switching element may be a MOS transistor, a bipolar transistor, an insulated-gate bipolar transistor (IGBT), a relay, or the like.

Moreover, at least some of processing units included in each of the luminaires or lighting devices according to the aforementioned embodiments are typically achieved as large-scale integrations (LSIs) which are integrated circuits. These may be separately mounted on one chip, or some or all of them may be mounted on one chip.

Moreover, the circuit configurations illustrated in the above-described circuit diagrams are examples, and the present disclosure is not limited to the circuit configurations. In other words, like the circuit configurations, the present disclosure includes circuits capable of serving the characteristic functions of the present disclosure. For example, the present disclosure also includes an element to which a switching element (e.g., transistor), a resistance element, or a capacitative element is connected in series or parallel, to an extent that the same functions as the circuit configurations can be served. In other words, the term "connected" in the aforementioned embodiments is not limited to two terminals (nodes) being directly connected, and includes a case in which the two terminals (nodes) are connected via an element to an extent that the same functions can be served.

Moreover, the logic levels represented as high and low or switching states represented as on and off are exemplified for specifically describing the present disclosure, and a different combination of the exemplified logic levels or switching states can lead to an equivalent result. Furthermore, the configuration of the logic circuit described above is exemplified for specifically describing the present disclosure, and a different logic circuit can achieve an equivalent input and output relationship.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A lighting device which supplies a light-emitting element with a current modulated based on a visible light communication signal, the lighting device comprising:
    a DC power supply circuit which supplies the light-emitting element with a first voltage;
    a signal generation circuit which generates a control signal based on the visible light communication signal, the control signal causing an average current value of a current flowing through the light-emitting element to be constant;
    a current control element which is connected in series to the light-emitting element and turned on and off based on the control signal;
    a DC power supply control circuit which causes a second voltage at a first node between the light-emitting element and the current control element to be a constant value, by controlling the DC power supply circuit based on the second voltage; and
    a first feedback circuit which is connected between the first node and the DC power supply control circuit, and supplies the DC power supply control circuit with the second voltage,
    wherein the first feedback circuit supplies the DC power supply control circuit with a predetermined voltage in a period in which the current control element is off.

2. The lighting device according to claim 1, wherein the first feedback circuit supplies the DC power supply control circuit with the second voltage in a period in which the current control element is on, and the predetermined voltage is higher than the second voltage in the period in which the current control element is on.

3. The lighting device according to claim 2, wherein the predetermined voltage is based on a voltage supplied by a voltage source.

4. The lighting device according to claim 1, wherein the first feedback circuit supplies the DC power supply control circuit with the second voltage in a period in which the current control element is on, and the predetermined voltage is lower than the second voltage in the period in which the current control element is on.

5. The lighting device according to claim 4, wherein the predetermined voltage is a ground potential.

6. The lighting device according to claim 1, wherein the first feedback circuit includes:
    a diode which is connected in series between the first node and the DC power supply control circuit; and
    a resistor which is connected in series between a voltage source and a second node between the diode and the DC power supply control circuit.

7. The lighting device according to claim 1, wherein the first feedback circuit includes:
    a resistor which is connected in series between the first node and the DC power supply control circuit; and
    a transistor which is connected between a ground potential and a second node between the resistor and the DC power supply control circuit, and
    the transistor is turned on in the period in which the current control element is off, and is turned off in a period in which the current control element is on.

8. The lighting device according to claim 1, wherein the first feedback circuit includes:
    a resistor which is connected in series between the first node and the DC power supply control circuit; and
    a diode which is connected between a ground potential and a second node between the resistor and the DC power supply control circuit.

9. The lighting device according to claim 1, further comprising:
    a second feedback circuit which is connected between the first node and the DC power supply control circuit, and supplies the DC power supply control circuit with the second voltage,
    wherein the second feedback circuit supplies the DC power supply control circuit with a predetermined voltage in the period in which the current control element is off,
    the DC power supply control circuit includes:
        a first determination circuit which amplifies a difference between a first reference voltage and a voltage supplied by the first feedback circuit; and
        a second determination circuit which determines whether a voltage supplied by the second feedback circuit is higher than a second reference voltage that is higher than the first reference voltage, and
    a response speed of the second determination circuit is faster than a response speed of the first determination circuit.

10. The lighting device according to claim 9, wherein the DC power supply control circuit further includes:
    a single photocoupler which transmits a signal indicating a determination result of the first determination circuit, and a signal indicating a determination result of the second determination circuit; and a control circuit which controls the DC power supply circuit based on the signals transmitted by the single photocoupler.

11. The lighting device according to claim 1, wherein the DC power supply circuit outputs the first voltage which causes the second voltage to be greater than an amplitude of a pulsating voltage included in the first voltage.

12. The lighting device according to claim 1, further comprising:
a current control circuit which turns on and off the current control element based on the control signal, and adjusts, to a constant current value, a current flowing through the light-emitting element in a period in which the current control element is on, by controlling the current control element, the constant current value corresponding to a constant current instruction signal.

13. A luminaire comprising:
the lighting device according to claim 1; and
the light-emitting element.

14. A signboard comprising:
a sign housing; and
the lighting device according to claim 1.

* * * * *